(12) United States Patent
Maeda et al.

(10) Patent No.: US 8,436,339 B2
(45) Date of Patent: May 7, 2013

(54) GATE INSULATING FILM FORMING AGENT FOR THIN-FILM TRANSISTOR

(75) Inventors: Shinichi Maeda, Funabashi (JP); Takahiro Kishioka, Funabashi (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 384 days.

(21) Appl. No.: 12/451,730

(22) PCT Filed: May 28, 2008

(86) PCT No.: PCT/JP2008/059819
§ 371 (c)(1),
(2), (4) Date: Nov. 27, 2009

(87) PCT Pub. No.: WO2008/146847
PCT Pub. Date: Dec. 4, 2008

(65) Prior Publication Data
US 2010/0133518 A1    Jun. 3, 2010

(30) Foreign Application Priority Data
May 30, 2007   (JP) .................................. 2007-143772

(51) Int. Cl.
*H01L 29/08*  (2006.01)
(52) U.S. Cl.
USPC .............................................. 257/40; 438/99
(58) Field of Classification Search ............... 257/40, 257/E27.117–E27.119, E51.001–E51.052; 438/99
See application file for complete search history.

(56) References Cited

U.S. PATENT DOCUMENTS 7,482,625 B2 *  1/2009  Kim et al. ....................... 257/40

FOREIGN PATENT DOCUMENTS

| EP | 1 333 061 A1 | 8/2003 |
|---|---|---|
| EP | 1 560 070 A1 | 8/2005 |
| EP | 1 757 986 A1 | 2/2007 |
| JP | A 2003-258260 | 9/2003 |
| JP | A 2004-072049 | 3/2004 |
| WO | WO 2004/034148 A1 | 4/2004 |
| WO | WO 2006/137366 A1 | 12/2006 |

OTHER PUBLICATIONS

Supplementary European Search Report issued in European Patent Application No. 08 77 6934.5 dated May 25, 2010.
Y. Kato et al., "High mobility of pentacene field-effect transistors with polyimide gate dielectric layers," Applied Physics Letters, vol. 84, No. 19, May 10, 2004, pp. 3789-3791.

(Continued)

*Primary Examiner* — Jenny L Wagner
*Assistant Examiner* — Mark Tornow
(74) *Attorney, Agent, or Firm* — Oliff & Berridge, PLC

(57) ABSTRACT

There is provided a novel gate insulating film forming material in consideration of not only initial electric properties immediately after the production of a gate insulating film, but also electric properties after other steps are performed while producing a thin-film transistor using the gate insulating film, and even reliability in the electric properties of the produced element. A gate insulating film forming agent for a thin-film transistor comprising an oligomer compound or a polymer compound, both of which contain a repeating unit having a triazinetrione ring containing a hydroxyalkyl-containing group as a substituent on a nitrogen atom, and a solvent; a gate insulating film produced from the gate insulating film forming agent; a thin-film transistor having the gate insulating film; and a method for producing the gate insulating film or thin-film transistor.

9 Claims, 2 Drawing Sheets

OTHER PUBLICATIONS

M. Halik et al., "High-mobility organic thin-film transistors based on α, α'-didecyloligothiophenes," Journal of Applied Physics. vol. 93, No. 5, Mar. 1, 2003, pp. 2977-2981.

International Search Report issued in corresponding International Application No. PCT/JP2008/059819, mailed Aug. 5, 2008.

Written Opinion of the International Searching Authority issued in corresponding International Application No. PCT/JP2008/059819, mailed Aug. 5, 2008.

International Preliminary Report on Patentability issued corresponding International Application No. PCT/JP2008/059819, issued Jan. 12, 2010.

Arai et al., "Self-Aligned Fabrication Process of Electrodes on flexible Substrate Using Photo-Sensitive SAM," *The Conference Book of the 67th Autumn Meeting of the Japan Society of Applied Physics*, 2006, 29 a-ZH-5, pp. 1210.

* cited by examiner

GATE INSULATING FILM FORMING AGENT FOR THIN-FILM TRANSISTOR

TECHNICAL FIELD

The present invention relates to a gate insulating film that retains excellent insulating properties even after exposure to ultraviolet radiation and also to a thin-film transistor produced using this gate insulating film.

BACKGROUND ART

Currently, organic transistors (thin-film transistors) using plastic substrates including polycarbonate and polyethylene terephthalate are under study as flexible devices such as electric paper. However, due to a problem that such plastic substrates slightly expand or contract when heated, improvement in heat resistance properties (low thermal expansion properties) is an urgent issue.

Meanwhile, production processes of an organic thin-film transistor at a lower temperature are under study in order to reduce thermal stress on plastic substrates. Forming and curing a gate insulating film is one of the processes that require highest temperature in producing an organic thin-film transistor. Therefore, a production process of a gate insulating film at a lower temperature has been required.

Developed methods for forming a gate insulating film at a low temperature include a method for anodizing the surface of a gate electrode (see Patent Document 1) and a method including chemical vapor deposition (see Patent Document 2), both of which have complicated production processes.

Therefore, a material that can be easily formed into a film by coating methods such as spin coating or printing is desired. As an example of the production of a gate insulating film by coating, a solution containing poly-4-vinylphenol and poly (melamine-formaldehyde) is applied by spin-coating, followed by curing at 200° C. (see Non-patent Document 1). However, in this method, the treatment temperature is as high as 200° C. and causes a significant influence of the thermal expansion and contraction of a plastic substrate. Therefore, it is difficult to use the method for producing electric paper or the like that is required to have fine pixels.

Soluble polyimides are known as one of the insulating materials that can be produced at a relatively low temperature and expected to have high insulating properties. Since polyimides generally have a high thermal decomposition temperature and a high electric resistance, they are widely used as insulating materials for electronic devices. Disclosed is an example in which a polyimide cured at 180° C. is used as a gate insulating film for a high-precision organic transistor (see Non-patent Document 2).

In recent years, with thin-film transistors having excellent mechanical flexibility, such as organic transistors in particular, electrodes and wirings are formed by irradiation with high-energy ultraviolet rays to reduce production cost (see Non-patent Document 3).

[Patent Document 1]
  Japanese Patent Application Publication No. JP-A-2003-258260
[Patent Document 2]
  Japanese Patent Application Publication No. JP-A-2004-72049
[Non-patent Document 1]
  Journal of Applied Physics (J. Appl. Phys.), Vol. 93, No. 5, 1 Mar. 2003, pp. 2997-2981.

[Non-patent Document 2]
  Applied Physics Letters (Appl. Phys. Lett.), Vol. 84, No. 19, 10 May 2004, pp. 3789-3791.
[Non-patent Document 3]
  2006 *Nen Shu-ki Dai 67 Kai Ouyo-Butsuri Gakkai Gakujutsu Koenkai Kouen Yoko-shu* (The Conference Book of the 67th Autumn Meeting of The Japan Society of Applied Physics, 2006), 29 a-ZH-5, 2006, p. 1210.

DISCLOSURE OF THE INVENTION

Problem to be Solved by the Invention

As described above, in order to produce highly reliable thin-film transistors, quality requirements on insulating materials are very high. The insulating materials are required, for example, to allow the production of thin-film transistors at a relatively low temperature, for example at 180° C. or lower by a simple process, and to have high insulating properties.

However, a gate insulating film made of a general organic polymer has a problem that its insulating properties are reduced after exposure to ultraviolet radiation. Among the soluble polyimides, a polyimide that includes aliphatic acid anhydride considered to have especially high insulating properties is also not an exception, in which there is a problem that light resistance against the irradiation of ultraviolet rays is low.

In addition, soluble polyimides have low solvent solubility and are dissolved in a limited range of solvents (only solvents with high polarity and high boiling points), which leads to a disadvantage that a composition having a high solid content is difficult to produce.

As described above, even though processing an insulating film at a lower temperature is important for the production process of thin-film transistors, there is not so many choices of materials for an insulating film that are applicable to coating, can be produced in a process at 180° C. or lower, and have preferable electric properties. Even soluble polyimides that are considered to meet all these requirements have, as described above, problems such as low solubility and low light resistance.

In order to solve the problems described above, it is an object of the present invention to provide a novel gate insulating film forming agent in consideration of not only initial electric properties immediately after the production of a gate insulating film, but also electric properties after other steps are performed while producing a thin-film transistor using the gate insulating film, and even reliability in the electric properties of the produced element, particularly from a viewpoint of practicality.

Means for Solving the Problem

The inventors of the present invention have carried out intensive studies to achieve the above-described objects. As a result, they have found that a gate insulating film, which has insulating properties as a gate insulating film and is excellent in light resistance that had been insufficient in related-art insulating film materials, can be produced by forming a cured film using a compound containing certain repeating units having a triazinetrione ring.

The present invention relates to, according to a first aspect, a gate insulating film forming agent for a thin-film transistor characterized by including an oligomer compound or a polymer compound, both of which contain a repeating unit having a triazinetrione ring containing a hydroxyalkyl-containing group as a substituent on a nitrogen atom.

The present invention relates to, according to a second aspect, the gate insulating film forming agent for a thin-film transistor according to the first aspect characterized by further including a solvent.

The present invention relates to, according to a third aspect, the gate insulating film forming agent for a thin-film transistor according to the first or the second aspect, in which the oligomer compound or the polymer compound is a compound containing a repeating unit having a structure in which a nitrogen atom in a triazinetrione ring is bonded to a nitrogen atom in another triazinetrione ring via a hydroxyalkylene group.

The present invention relates to, according to a fourth aspect, the gate insulating film forming agent for a thin-film transistor according to any one of the first to the third aspects, in which the oligomer compound or the polymer compound is a compound containing a repeating unit represented by the following formula (1):

[ChemicalFormula 1]

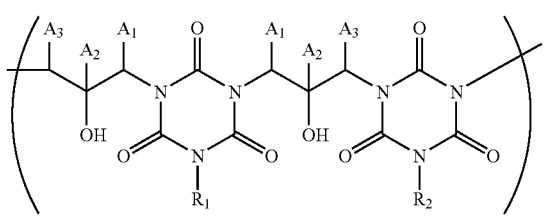

(1)

(where $R_1$ and $R_2$ independently represent an alkyl group with 1 to 6 carbon atoms, an alkenyl group with 3 to 6 carbon atoms, a trifluoromethyl group, or a pentafluoroethyl group, and $A_1$, $A_2$, and $A_3$ independently represent a hydrogen atom, a methyl group, or an ethyl group).

The present invention relates to, according to a fifth aspect, the gate insulating film forming agent for a thin-film transistor according to any one of the first to fourth aspects, in which the oligomer compound or the polymer compound is a reaction product between compounds represented by the following formula (2) and formula (3):

[Chemical Formula 2]

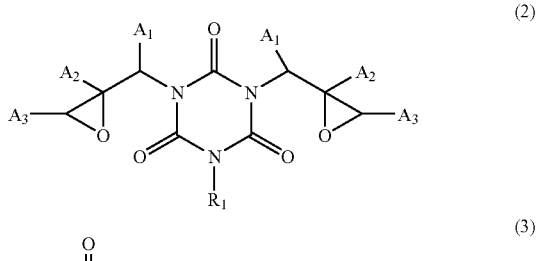

(2)

(3)

(where $R_1$, $R_2$, $A_1$, $A_2$, and $A_3$ are the same as defined in the formula (1)).

The present invention relates to, according to a sixth aspect, the gate insulating film forming agent for a thin-film transistor according to the fourth aspect, in which an end of the repeating unit represented by the formula (1) is blocked with a group represented by the following formula (4) or formula (5):

[Chemical Formula 3]

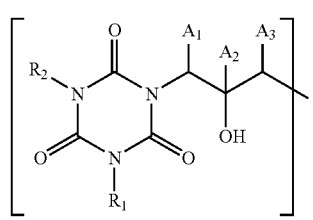

(4)

(5)

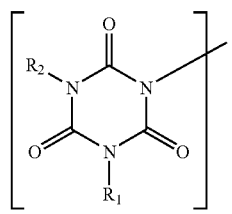

(where $R_1$, $R_2$, $A_1$, $A_2$, and $A_3$ are the same as defined in the formula (1)).

The present invention relates to, according to a seventh aspect, the gate insulating film forming agent for a thin-film transistor according to the fifth aspect, produced by reacting a compound represented by the following formula (6) or formula (7) as a terminal blocking agent with the reaction product between the compounds represented by the formula (2) and formula (3):

[Chemical Formula 4]

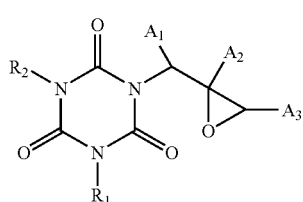

(6)

(7)

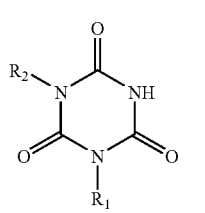

(where $R_1$, $R_2$, $A_1$, $A_2$, and $A_3$ are the same as defined in the formula (1)).

The present invention relates to, according to an eighth aspect, a gate insulating film formed by using the gate insulating film forming agent for a thin-film transistor as described in any one of the first to the seventh aspects.

The present invention relates to, according to a ninth aspect, a thin-film transistor having the gate insulating film as described in the eighth aspect.

The present invention relates to, according to a tenth aspect, a method for producing a gate insulating film for a thin-film transistor, including: applying the gate insulating film forming agent for a thin-film transistor as described in any one of the first to the seventh aspects on a substrate, and then baking at a temperature of 180° C. or lower.

The present invention relates to, according to an eleventh aspect, a method for producing a thin-film transistor, including: applying the gate insulating film forming agent for a thin-film transistor as described in any one of the first to the seventh aspects on a substrate and then baking at a temperature of 180° C. or lower, to obtain a gate insulating film for a thin-film transistor; and forming a semiconductor layer of the thin-film transistor by applying an organic semiconductor.

EFFECTS OF THE INVENTION

By using the gate insulating film forming agent for a thin-film transistor of the present invention, a gate insulating film can be produced by forming a film by coating and at a baking temperature of 180° C. or lower, similarly to a related-art film forming agent containing a soluble polyimide.

The gate insulating film forming agent for a thin-film transistor of the present invention is easily soluble in a wide variety of solvents, that is, has high solvent solubility enabling the easy adjustment of a solid concentration. Therefore, a gate insulating film with a suitable film thickness can be produced with ease.

Then, the gate insulating film of the present invention that is formed using the gate insulating film forming agent for a thin-film transistor meets the level of insulating properties required as a gate insulating film and provides a low leakage current of a gate.

Especially, the gate insulating film of the present invention shows very small deterioration of the insulating properties after ultraviolet irradiation, has a characteristic excellent in light resistance, and is excellent in transparency.

Moreover, in the gate insulating film of the present invention, a compound constituting the film contains a triazinetrione ring. Therefore, the gate insulating film has higher dielectric breakdown voltage compared with, for example, an insulating film constituted mainly of an acrylic skeleton, and is highly reliable as a gate insulating film for a thin-film transistor that requires application of a high electrical field to the gate insulating film.

Furthermore, the thin-film transistor including the gate insulating film of the present invention can be an organic thin-film transistor that provides a low source-drain leakage current, has a large on/off ratio, has high field-effect mobility, and has a small threshold voltage shift. In addition, the thin-film transistor including the gate insulating film of the present invention can retain these electric properties for a long time.

BEST MODES FOR CARRYING OUT THE INVENTION

The gate insulating film forming agent for a thin-film transistor of the present invention includes an oligomer compound or a polymer compound containing repeating units having a triazinetrione ring containing a hydroxyalkyl-containing group as a substituent on a nitrogen atom, includes a solvent if needed, and further includes a crosslinking agent, a surfactant, a coupling agent or the like as an optional component.

In detail, the gate insulating film forming agent for a thin-film transistor of the present invention includes the oligomer compound or the polymer compound containing repeating units having a structure in which a nitrogen atom in a triazinetrione ring is bonded to a nitrogen atom in another triazinetrione ring via a hydroxyalkylene group, a solvent if needed, and other optional components described as above.

The solid content of the gate insulating film forming agent for a thin-film transistor of the present invention is, for example, 0.1 to 50% by mass or, for example, 0.5 to 30% by mass.

Specific examples of the oligomer compound or the polymer compound include a compound containing repeating units represented by the following general formula (1):

[Chemical Formula 5]

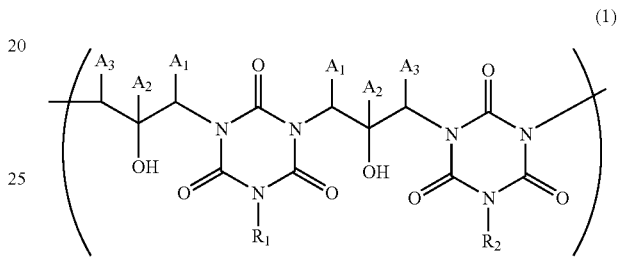

where $R_1$ and $R_2$ independently represent an alkyl group with 1 to 6 carbon atoms, an alkenyl group with 3 to 6 carbon atoms, a trifluoromethyl group, or a pentafluoroethyl group, and $A_1$, $A_2$, and $A_3$ independently represent a hydrogen atom, a methyl group, or an ethyl group.

Examples of the alkyl group with 1 to 6 carbon atoms include a methyl group, an ethyl group, an n-pentyl group, an isopropyl group, and a cyclohexyl group.

Examples of the alkenyl group with 3 to 6 carbon atoms include an allyl group, a 2-butenyl group, a 3-butenyl group, and a 2-pentenyl group.

The oligomer compound or the polymer compound used for the present invention has a characteristic of high transparency in ultraviolet region, has preferably a highly transparent substituent as repeating units represented by the formula (1) and as a substituent represented by $R_1$ and $R_2$. An alkyl group, an alkenyl group, a fluoroalkyl group, and an alicyclic group such as cyclohexane are most suitable as such a substituent. An aromatic group such as a phenyl group, a benzyl group, and a naphthalene group can also be used as long as transparency is not impaired.

The optimal molecular weight of the oligomer compound or the polymer compound used for the present invention is not particularly limited. However, when the molecular weight is too low, solvent solubility becomes too high. Because of this, the compound may not be applicable for the production process of a transistor_ On the other hand, when the molecular weight is too high, solvent solubility becomes low. Because of this, a gate insulating film forming agent for a thin-film transistor with a high solid concentration may not be produced. Therefore, a preferable molecular weight is, for example, a weight average molecular weight (as converted into polystyrene) of 1,000 to 200,000 or, more preferably, 5,000 to 50,000.

Although a method for producing the oligomer compound or the polymer compound used for the present invention is not particularly limited, the compound can be produced, for example, by carrying out a polycondensation reaction between a compound represented by the following formula (2) and a compound represented by the following formula (3) in an appropriate organic solvent:

[Chemical Formula 6]

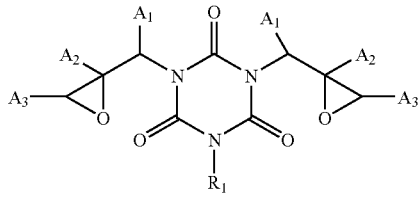
(2)

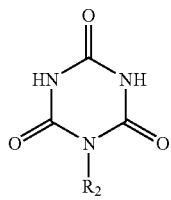
(3)

(where $R_1$, $R_2$, $A_1$, $A_2$, and $A_3$ are the same as defined in the formula (1)).

Preferable examples of the compound represented by the formula (2) include compounds represented by the following formulae (A-1) to (A-7):

[Chemical Formula 7]

(A-1)

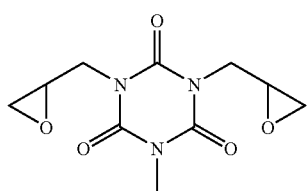

(A-2)

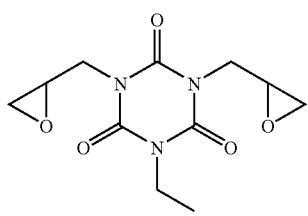

(A-3)

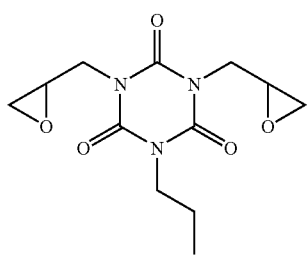

[Chemical Formula 8]

(A-4)

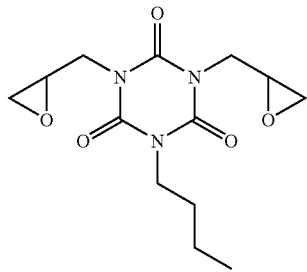

(A-5)

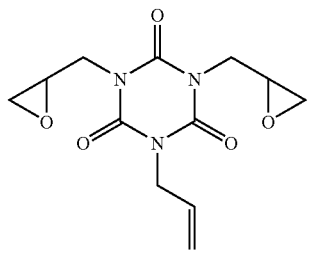

(A-6)

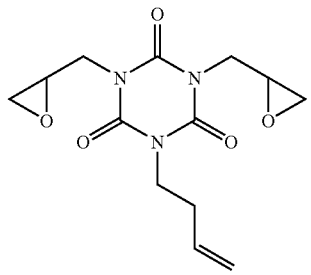

[Chemical Formula 9]

(A-7)

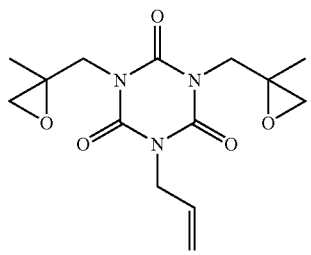

In addition to the compounds represented by the formulae (A-1) to (A-7), compounds represented by the following formulae (A-8) to (A-10) may also be used as the compound represented by the formula (2) as long as the electric properties of the thin-film transistor is not deteriorated.

[Chemical Formula 10]

(A-8)

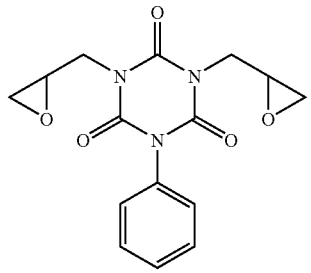

(A-9)
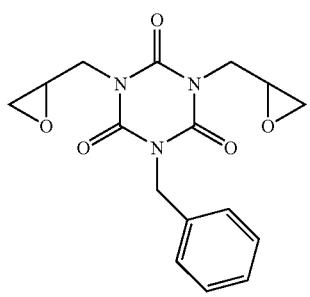

(A-10)
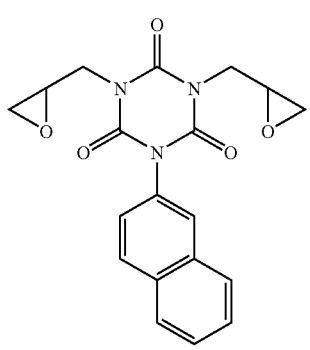

Preferable specific examples of the compound represented by the formula (3) include compounds represented by the following formulae (B-1) to (B-6):

[Chemical Formula 11]

(B-1)
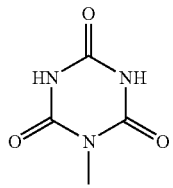

(B-2)
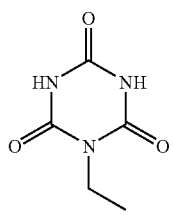

(B-3)
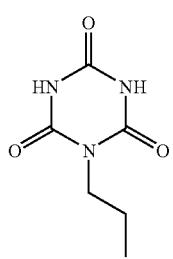

(B-4)
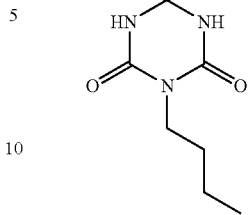

(B-5)
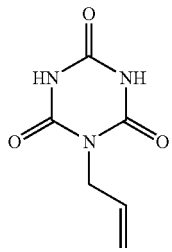

(B-6)
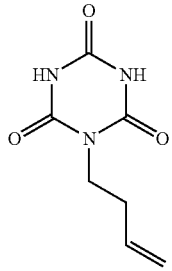

In addition to the compounds represented by the formulae (B-1) to (B-6), compounds represented by the following formulae (B-7) to (B-9) may also be used as the compound represented by the formula (3) as long as the electric properties of the thin-film transistor is not deteriorated.

[Chemical Formula 12]

(B-7)
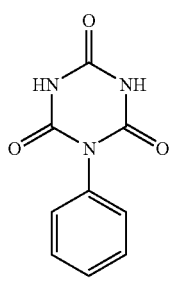

(B-8)
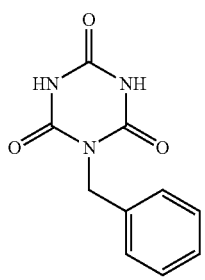

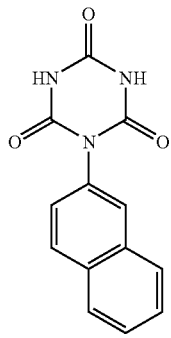

(B-9)

By selecting only the compounds represented by the formulae (A-1) to (A-7) as the compound represented by the formula (2) as well as only the compounds represented by the formula (B-1) to formula (B-6) as the compound represented by the formula (3), followed by carrying out a polycondensation reaction between the selected compounds, an oligomer compound or a polymer compound with especially high insulating properties and high transparency in ultraviolet region can be produced, which is a compound suitable for the use as a gate insulating film forming agent for a thin-film transistor.

During the above described polycondensation reaction, a terminal blocking agent can be used so as to improve heat resistance and solvent solubility. A compound which has reactivity with the terminal group (an imide group and an epoxy group) of a reaction product between both compounds represented by the formula (2) and formula (3) can be used as a terminal blocking agent.

Examples of the above described compound which has reactivity with an imide group include various epoxy compounds, halogenated compounds, and isocyanate.

Especially, a compound represented by the following formula (6) is preferable in terms of transparency, heat resistance, and insulating properties:

[Chemical Formula 13]

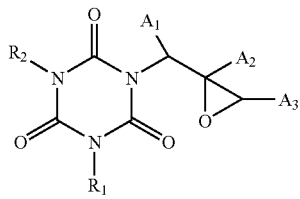

(6)

(where $R_1$, $R_2$, $A_1$, $A_2$, and $A_3$ are the same as defined in the formula (1)).

A compound represented by the following formula (8) is especially preferable among the compounds represented by the formula (6):

[Chemical Formula 14]

(8)

Examples of the above described compound which has reactivity with an epoxy group include imides, isocyanuric acid, carboxylic acid, isocyanate, and amines because of its easy handling or the like. Additionally, acid anhydride, halides, esters, and alcohols and others may be used.

Especially, a compound represented by the following formula (7) is preferable in terms of transparency, heat resistance, and insulating properties:

[Chemical Formula 15]

(7)

(where $R_1$, $R_2$, $A_1$, $A_2$, and $A_3$ are the same as defined in the formula (1)).

Compounds represented by the following formulae (9) to (10) are especially preferable among the compounds represented by the formula (7).

[Chemical Formula 16]

(9)

(10)

(Polycondensation Reaction)

Examples of a method including mixing the compounds represented by the formula (2) and formula (3) in an organic solvent and carrying out a polycondensation reaction include: a method including heating and stirring a solution produced by dispersing or dissolving the compound represented by the formula (2) and the compound represented by the formula (3) in an organic solvent, followed by adding an appropriate catalyst dissolved in an organic solvent to effect a reaction; or a method including heating and stirring a solution produced by dispersing or dissolving the compound represented by the formula (2), the compound represented by the formula (3), and an appropriate catalyst in an organic solvent to effect a reaction.

When a plurality of types of the compounds represented by the formula (2) and the compounds represented by the formula (3) is present, a polycondensation reaction may be carried out under the condition in which the plurality of compounds is mixed beforehand, or may be carried out individually one after another.

In the above described polycondensation reaction, the compounding ratio of the compounds represented by the formula (2) and formula (3), that is, the ratio of the number of moles of the compound represented by the formula (2) to the number of moles of the compound represented by the formula (3) is desirably 1:0.5 to 1:1.5.

Similar to a general polycondensation reaction, as the molar ratio approaches 1:1, the polymerization degree of the generated compound increases leading to an increase in molecular weight.

When a terminal blocking agents represented by the formulae (6) to (10) are used, especially when a compound which has reactivity with the above imide group (the compound represented by the formula (6) or formula (8)) is used as a terminal blocking agent, the compounding ratio (the number of moles) of the formula (2) and the formula (3) in polycondensation is desirably 1:1.01 to 1:1.5.

When the compound which has reactivity with an epoxy group (a compound represented by the formula (7), or the formula (9), or the formula (10)) is used as a terminal blocking agent, the compounding ratio (the number of moles) of the formula (2) and the formula (3) in polycondensation is desirably 1.01:1 to 1.5:1.

Examples of an organic solvent used for the polycondensation reaction include ethyl lactate, butyl lactate, propylene glycol monomethylether, propylene glycol monomethylether acetate, N,N-dimethylformamide, N,N-dimethylformacetamide, N-methyl-2-pyrrolidone, N-methylcaprolactam, dimethylsulfoxide, tetramethylurea, pyridine, dimethylsulfone, hexamethylsulfoxide, γ-butyrolactone, ethylene glycol monomethylether, ethylene glycol monoethylether, methylcellosolve acetate, ethylcellosolve acetate, diethylene glycol monomethylether, diethylene glycol monoethylether, propylene glycol, propylene glycol propyl ether acetate, methyl ethyl ketone, cyclopentanone, cyclohexanone, 2-hydroxypropionic acid ethyl, 2-hydroxy-2-methylpropionic acid ethyl, ethoxyacetic acid ethyl ester, hydroxyacetic acid ethyl ester, 2-hydroxy-3-methylbutyric acid methyl ester, 3-methoxypropionic acid methyl ester, 3-methoxypropionic acid ethyl ester, 3-ethoxypropionic acid ethyl ester, 3-ethoxypropionic acid methyl ester, pyruvic acid methyl, pyruvic acid ethyl, ethyl acetate, and butyl acetate.

In the polycondensation reaction, quarternary ammonium salts such as benzyltriethylammonium chloride, tetrabutylammonium chloride, and tetraethylammonium bromide, or phosphonium salts such as triphenyiphosphine, ethyl triphenylphosphonium bromide, and tetrabutylphosphonium bromide can be preferably used as a reaction catalyst.

The reaction temperature and the reaction time of the polycondensation reaction depend on compounds used, concentrations, etc., but are selected appropriately from, for example, a reaction time ranging from 0.1 to 100 hours and a reaction temperature ranging from 20° C. to 200° C.

The reaction catalyst such as quarternary ammonium salts or phosphonium salts is preferably used at a range from 0.001 to 50% by mass to the total mass of compounds to be reacted (namely, the compounds represented by the formula (2) and the formula (3))

(Recovery and Washing of Reaction Product)

Although the thus produced reaction solution may be used as it is for a gate insulating film forming agent of a thin-film transistor, the reaction solution is preferably used for a gate insulating film forming agent after recovering and washing the reaction product, because the reaction solution contains the reaction catalyst, unreacted monomers, etc.

For recovering the reaction product, a method including putting a reaction solution into a poor solvent with stirring to precipitate the reaction product, followed by filtering the reaction product, is simple and convenient. Examples of the poor solvent used in the method, which is not particularly limited, include methanol, hexane, heptane, ethanol, toluene, water, and ether. After the precipitate is filtered to be recovered, it is preferable to wash the reaction product with the poor solvent. The recovered reaction product can be made into powdery form by drying under normal or reduced pressure at normal temperature or with heating.

The operation, in which the above described powdery reaction product is further dissolved in a good solvent and then is reprecipitated in a poor solvent, is repeated two to ten times, which can further reduce impurities in the reaction product. The refining efficiency is further improved by using three or more types of poor solvents such as alcohols, ketones, and hydrocarbons as the poor solvent in this operation.

The above mentioned terminal blocking agent may be used after the polycondensation reaction between the compound represented by the formula (2) and the compound represented by the formula (3), or during or after washing and recovering of the resultant reaction product.

(Solvent)

Examples of a preferable solvent used for the gate insulating film forming agent of a thin-film transistor of the present invention include ethylene glycol monomethylether, ethylene glycol monoethylether, ethylene glycol monobutylether, methylcellosolve acetate, ethylcellosolve acetate, diethylene glycol monomethylether, diethylene glycol monoethylether, propylene glycol, propylene glycol monomethylether, propylene glycol monomethylether acetate, propylene glycol propyl ether acetate, propylene glycol monobutylether, propylene glycol monobutylether acetate, methyl ethyl ketone, cyclopentanone, cyclohexanone, 2-hydroxypropionic acid ethyl, 2-hydroxy-2-methylpropionic acid ethyl, ethoxyacetic acid ethyl ester, hydroxyacetic acid ethyl ester, 2-hydroxy-3-methylbutyric acid methyl ester, 3-methoxypropionic acid methyl ester, 3-methoxypropionic acid ethyl ester, 3-ethoxypropionic acid ethyl ester, 3-ethoxypropionic acid methyl ester, pyruvic acid methyl, pyruvic acid ethyl, ethyl acetate, butyl acetate, ethyl lactate, butyl lactate, lactic acid methylic ester, lactic acid ethyl ester, lactic acid n-propyl ester, lactic acid n-butyl ester, lactic acid isoamyl ester, N,N-dimethylformamide, N,N-dimethylformacetamide, N-methyl-2-pyrrolidone, N-methylcaprolactam, dimethylsulfoxide, tetramethylurea, pyridine, dimethylsulfone, hexamethylsulfoxide, and γ-butyrolactone.

A solvent may be selected and used appropriately from these solvents depending on the molecular weight of the oligomer compound or the polymer compound contained in the gate insulating film forming agent for a thin-film transistor of the present invention. A plurality of types of solvents may be used in combination to, for example, adjust the surface tension of the forming agent or adjust the wettability of the forming agent to a substrate.

(Other Additives: Crosslinking Agent and Crosslinking Catalyst)

It is preferable to crosslink the gate insulating film forming agent for a thin-film transistor of the present invention after applying it on the substrate, in order to prevent intermixing of the gate insulating film forming agent with a semiconductor material to be top coated or an electrode material. In other words, the forming agent can further contain a crosslinking agent component.

Examples of the crosslinking agent include melamine compounds or substituted urea compounds with at least two or more cross linking substituents such as methylol groups and methoxymethyl groups, or polymer compounds containing epoxy groups. Specific examples of the crosslinking agent include: compounds as methoxymethylated glycouril or methoxymethylated melamine; preferably tetramethoxy methylglycoluril or hexamethoxymethylmelamine. The examples further include compounds such as tetramethoxymethyl urea and tetrabutoxymethyl urea.

The additive amount of the crosslinking agent varies depending on types of solvents used for the gate insulating film forming agent for a thin-film transistor and the solution viscosity required, and is 0.001 to 20% by mass, preferably 0.01 to 15% by mass, more preferably 0.05 to 10% by mass to the total mass of th$_e$ forming agent.

(Other Additives: Surfactant)

In the gate insulating film forming agent for a thin-film transistor of the present invention, a surfactant can be blended to inhibit the generation of pinholes, striation, etc. and to further improve coating properties against surface unevenness.

Examples of the surfactant include nonionic surfactants such as: polyoxyethylene alkyl ethers such as polyoxyethylene lauryl ether, polyoxyethylene stearyl ether, polyoxyethylene cetyl ether, and polyoxyethylene oleyl ether; polyoxyethylene alkyl aryl ethers such as polyoxyethylene octyl phenol ether and polyoxyethylene nonyl phenol ether; polyoxyethylene-polyoxypropylene block copolymers; sorbitan fatty acid esters such as sorbitan monolaurate, sorbitan monopalmitate, sorbitan monostearate, sorbitan monooleate, sorbitan trioleate, and sorbitan tristearate; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate, and fluorinated surfactants such as: EFTOP EF301, EF303, and EF352 (manufactured by JEMCO, Inc.); Megafac F171 and F173 (manufactured by DIC Corporation); Fluorade FC430 and FC431 (manufactured by Sumitomo 3M Limited); AsahiGuard AG710, and SURFRON S-382, SC101, SC102, SC103, SC104, SC105, and SC106 (manufactured by ASAHI GLASS CO., LTD.) ; and organosiloxane polymer KP341 (manufactured by Shin-Etsu Chemical Co., Ltd.).

The amounts blended of these surfactants are generally 0.2% by mass or less and preferably 0.1% by mass or less to the total mass of the gate insulating film forming agent for a thin-film transistor of the present invention. These surfactants can be added alone or in combination of two or more types thereof (Other Additives: Coupling Agent)

The gate insulating film forming agent for a thin-film transistor of the present invention can further contain a coupling agent in order to improve adhesion between the forming agent and a substrate as long as the effects of the present invention are not degraded. Examples of the coupling agent include a functional silane-containing compound and an epoxy group-containing organic compound.

Specific examples of the coupling agent include functional silane-containing compounds such as 3-aminopropyltrimethoxy silane, 3-aminopropyltriethoxy silane, 2-aminopropyltrimethoxy silane, 2-aminopropyltriethoxy silane, N-(2-aminoethyl)-3-aminopropyltrimethoxy silane, N-(2-aminoethyl)-3-aminopropylmethyldimethoxy silane, 3-ureidopropyltrimethoxy silane, 3-ureidopropyltriethoxy silane, N-ethoxycarbonyl-3-aminopropyltrimethoxy silane, N-ethoxycarbonyl-3-aminopropyltriethoxy silane, N-trimethoxysilyl propyltriethylene triamine, N-triethoxysilyl propyltriethylene triamine, 10-trimethoxysilyl-1,4,7-triazadecan, 10-triethoxysilyl-1,4,7-triazadecan, 9-trimethoxysilyl-3,6-diazanonyl acetate, 9-triethoxysilyl-3,6-diazanonyl acetate, N-benzyl-3-aminopropyltrimethoxy silane, N-benzyl-3-aminopropyltriethoxy silane, N-phenyl-3-aminopropyltrimethoxy silane, N-phenyl-3-aminopropyltriethoxy silane, N-bis(oxyethylene)-3-aminopropyltrimethoxy silane, and N-bis(oxyethylene)-3-aminopropyltriethoxy silane; and epoxy group-containing organic compounds such as ethylene glycol diglycidyl ether, polyethylene glycol diglycidyl ether, propylene glycol diglycidyl ether, tripropylene glycol diglycidyl ether, polypropylene glycol diglycidyl ether, neopentyl glycol diglycidyl ether, 1,6-hexanediol diglycidyl ether, glycerine diglycidyl ether, 2,2-dibromoneopentyl glycol diglycidyl ether, 6-tetraglycidyl-2,4-hexanediol, N,N,N',N'-tetraglycidy)-m-xylene diamine, 1,3-bis(N,N-diglycidyl aminomethyl)cyclohexane, and N,N,N',N'-tetraglycidyl-4, 4'-diaminodiphenylmethane.

The above coupling agent is added to be used at a content of preferably 0.1 to 30 parts by mass, more preferably 1 to 20 parts by mass based on 100 parts by mass of a gate insulating film forming agent for a thin-film transistor.

(Method of Producing Coating Film and Cured Film)

The gate insulating film forming agent for a thin-film transistor of the present invention is applied on a general-purpose plastic substrate such as polypropylene, polyethylene, polycarbonate, polyethylene terephthalate, polyethersulfone, polyethylene naphthalate, and polyimide, a glass substrate, or the like by dipping, spin coating, transfer printing, roll coating, ink-jet printing, and spraying, and the like, and then, is predried on a hotplate or in an oven, allowing to form a coating film.

Subsequently, this coating film is subjected to a heat treatment (baking) to be formed into a cured film that can be used as a gate insulating film.

Although the above method of the heat treatment is not particularly limited, examples of the method include using a hot$_p$late or an oven in an appropriate atmosphere, that is, in the air, in an inert gas such as nitrogen, in a vacuum, or the like.

A baking temperature to be used is preferably 40° C. or higher, more preferably 150° C. or higher, in terms of the reduction of the solvent remained in the coating film. Considering the heat resistance of a plastic substrate, 180° C. or lower is more desirable.

In baking, the temperature may vary in two or more stages. A stepwise baking can increase the evenness of a cured film.

The film thickness of the thus produced gate insulating film of the present invention is preferably 5 nm to 5000 nm, more preferably 50 nm to 1000 nm, and most preferably 200 nm to 600 nm. A too thin gate insulating film causes dielectric breakdown in a low electric field and does not work as a transistor, while a too thick gate insulating film requires high voltage for a transistor to work. Therefore, forming a film within the above described range of thickness is desired.

When a cured film (gate insulating film) with a desired thickness is not obtained by a single treatment of coating and heating, the treatment may be repeated until the desired film thickness is obtained.

(Thin-Film Transistor)

The thin-film transistor of the present invention has no particular limitation on its composition as long as the above described gate insulating film of the present invention is used. As an example, FIG. 1 to FIG. 4 show a composition example of the thin-film transistor in which the gate insulating film of the present invention is used.

The examples in FIG. 1 to FIG. 3 show that in the thin-film transistor of the present invention, a gate electrode 2 is formed on a substrate 1, and the gate electrode 2 is covered with a gate insulating film 3 (or 3a, 3b) of the present invention.

The example in FIG. 1 shows that a source electrode 4 and a drain electrode 4 are placed on the gate insulating film 3, and a semiconductor layer 5 is formed so as to cover the electrodes.

The example in FIG. 2 shows that the semiconductor layer 5 is formed on the gate insulating film 3, on which the source electrode 4 and the drain electrode 4 are placed.

The example in FIG. 3 shows that the gate insulating film 3b is formed on the gate insulating film 3a, on which the source electrode and the drain electrode are placed. The semiconductor layer 5 is formed so as to cover the electrodes. In this example, the gate insulating film 3b has functions not only as an insulating film to control the properties of the transistor, but also as a surface treatment film or an under layer film for forming electrodes of the source electrode 4 and the drain electrode 4.

The example in FIG. 4 shows a structure in which the semiconductor layer 5 is formed on the substrate 1, and the source electrode 4 and the drain electrode 4 are placed so as to cover both of the semiconductor layer 5 and the substrate 1. Then, the gate insulating film 3 is formed on the semiconductor layer 5, the source electrode 4, and the drain electrode 4, on which the gate electrode 2 is placed.

Examples of an electrode material (a gate electrode, a source electrode, and a drain electrode) used for the thin-film transistor of the present invention include metals such as gold, silver, copper, aluminum, and calcium; inorganic materials such as carbon black, fullerenes, and carbon nanotubes; and organic π-conjugated polymers such as polythiophene, polyaniline, polypyrrole, polyfluorene, and their derivatives.

These electrode materials may be used alone or in combination of a plurality of materials in order to improve the field effect mobility and the on/off ratio of the thin-film transistor or control the threshold voltage. Different electrode materials may be used for the gate electrode, the source electrode, and the drain electrode.

Although an electrode is generally formed by a method such as vacuum deposition or sputtering, electrode forming methods by using a coating method such as spraying, printing, and ink-jet printing have been developed to simplify the production method. In recent years, a coating method is developed, by which a high definition electrode pattern is formed by partially changing the surface energy of the gate insulating film by the irradiation of ultraviolet rays.

Examples of an electrode material that can be used for coating include metal nanoparticles and organic π-conjugated polymers.

A solvent for metal nanoparticles and organic π-conjugated polymers during the electrode formation by coating or the like is preferably water or various alcohols because of less damage (intermixing) to the gate insulating film of the present invention.

Polar solvents such as N,N-dimethylformamide, N,N-dimethylacetamide, 2-pyrrolidone, N-methyl-2-pyrrolidone, n-ethyl-2-pyrrolidone, n-vinyl-2-pyrrolidone, N-methylcaprolactam, dimethylsulfoxide, and tetramethylurea are preferable due to its excellent solubility in electrode materials. The solvents are preferably used to the extent that the gate insulating film of the present invention is less damaged.

Materials used for a semiconductor layer included in the thin-film transistor of the present invention are not particularly limited as long as the materials can be formed on the gate insulating film, the above mentioned electrodes, and the above mentioned plastic substrate. Specific examples of the materials include organic low molecular weight materials such as pentacene, an oligothiophene derivative, and a phthalocyanine derivative; π-conjugated polymers such as a polythiophene derivative, a polyphenylenevinylene derivative, and a polyfluorene derivative; oxide semiconductors such as InGaZnO, InGaO, ZnGaO, InZnO, ZnO, and $SnO_2$.

As a film forming method of these semiconductor materials, sputtering, vacuum deposition, ink-jet printing, spraying or the like can be used. Especially, ink-jet printing and spraying are simple and convenient, and are preferable in terms of reduction in production cost.

Examples of a semiconductor material appropriate for coating include π-conjugated polymers that have high solvent solubility and provide an uniform thin film easily.

There is no particular limitation on the solvent of π-conjugated polymers for forming a film, as long as the solvent can dissolve or evenly disperse π-conjugated polymers and causes less damage (intermixing) to the gate insulating film of the present invention, and examples thereof include xylene, trichlorobenzene, trimethylbenzene, and the like.

EXAMPLES

The present invention will be described in further detail with reference to the following examples, though the present invention is not limited thereto.

(Measurement of Number-Average Molecular Weight and Weight-Average Molecular Weight)

In the present example, the molecular weights of P-1, P-2, and P-3 produced by polymerization were measured by using a room temperature gel permeation chromatography (GPC) apparatus to calculate the number-average molecular weight and the weight-average molecular weight as a polystyrene-converted value.

GPC apparatus: (JASCO-BORWIN Ver. 1.50) manufactured by JASCO Corporation

Column: (a serial of 804 and 805) manufactured by Shodex Corporation

Column temperature: 40° C.

Eluate: tetrahydrofuran

Flow rate: 1.0 mL/min.

Standard sample for preparing a calibration curve: standard polystyrene (210,000, 70,600, 28,600, 10,900, 3,000, 1,300)

In the present example, the molecular weight of P-4 produced by polymerization was measured by using a GPC apparatus to calculate the number-average molecular weights and the weight-average molecular weights as polyethylene glycol-converted values and polyethyleneoxide-converted values.

GPC apparatus: manufactured by Shodex Corporation (GPC-101)

Column: manufactured by Shodex Corporation (a serial of KD803 and KD805)

Column temperature: 50° C.

Eluate: N,N-dimethylformamide (30 mmol/L of lithium bromide-hydrate ($LiBr.H_2O$), 30 mmol/L of phosphoric anhydride crystal (o-phosphoric acid), and 10 ml/L of tetrahydrofuran (THF) as additives)

Flow rate: 1.0 ml/min.

Standard sample for preparing a calibration curve: standard polyethylene oxide (a molecular weight of about 900,000, 150,000, 100,000, 30,000) and polyethylene glycol manufactured by Polymer Laboratories Ltd. (a molecular weight of about 12,000, 4,000, 1,000)

(Measurement of Film Thickness)

The film thickness was determined by measuring the level difference after peeling a part of the film with a retractable knife by using a fully automatic microfigure measuring instrument (ET4000A; manufactured by Kosaka Laboratory Ltd.) at a measuring force of 10 μN and a sweep rate of 0.05 mm/sec.

(Synthesis of Polymer Compound Used for Gate Insulating Film Forming Agent for Thin-Film Transistor)

Synthesis Example 1

P-1

40 g of monoallyldiglycidyl isocyanuric acid, 24.4 g of monoallyl isocyanuric acid, and 1.6 g of benzyltriethylammonium chloride were put into 258 g of cyclohexanone, and the resultant mixture was heated to 120° C. and stirred for 8 hours with simultaneously introducing nitrogen into the mixture. Subsequently, the resultant reaction solution was dropped into a methanol solvent, and a reaction product P-1 (white powder) was produced by filtering the precipitate separated out.

The GPC analysis of the reaction product P-1 was performed and found that the weight average molecular weight as converted into standard polystyrene was 9,900.

The reaction product P-1 contains a compound having a structural unit represented by the following formula (11):

[Chemical Formula 17]

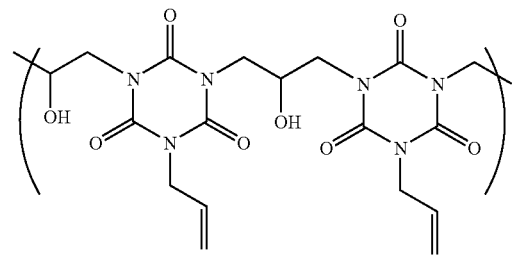

(11)

Synthesis Example 2

Synthesis of P-2

15 g of monoallyldiglycidyl isocyanuric acid, 11.2 g of monoallyl isocyanuric acid, and 0.8 g of benzyltriethylammonium chloride were put into 61.1 g of cyclohexanone, and the resultant mixture was heated to 120° C. and stirred for 12 hours with simultaneously introducing nitrogen into the mixture. Subsequently, the resultant reaction solution was dropped into the mixed solvent of diethylether and methanol, and an intermediate product (white powder) was produced by filtering the deposited precipitate. The GPC analysis of the intermediate product was performed and found that the weight average molecular weight as converted into standard polystyrene was 6,400.

Next, 4.3 g of a diallyl monoglycidyl isocyanurie acid, 0.1 g of benzyltriethylammonium chloride, and 31.1 g of cyclohexanone were added to 9 g of the thus produced intermediate product (white powder), and the resultant mixture was heated to 120° C. and stirred for 8 hours. Subsequently, the resultant reaction solution was dropped into the mixed solvent composed of 95% by weight of diethylether and 5% by weight of methanol, and a reaction product P-2 (white powder) was produced by filtering the precipitate separated out.

The GPC analysis of the reaction product P-2 was performed and found that the weight average molecular weight as converted into standard polystyrene was 18,100.

The reaction product P-2 contains a compound having a structural unit represented by the following formula (12):

[Chemical Formula 18]

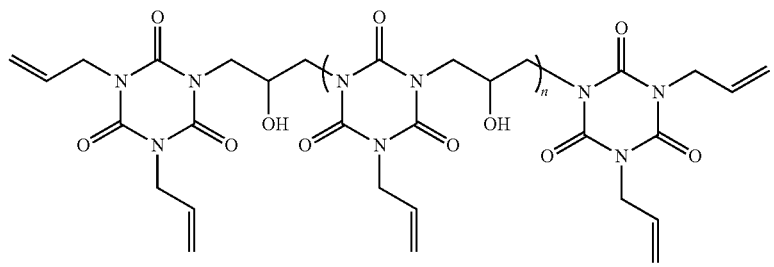

(12)

(in Formula (12), $n$ represents a positive integer).

Synthesis Example 3

Synthesis of P-3

20 g of monoallyldiglycidyl isocyanuric acid, 13.4 g of monobutyl isocyanuric acid, and 0.8 g of benzyltriethylammonium chloride were put into 111 g of propylene glycol monomethylether, and the resultant mixture was heated under reflux and stirred for 15 hours with simultaneously introducing nitrogen into the mixture. Next, the resultant reaction solution was dropped into a methanol solvent, and a reaction product P-3 (white powder) was produced by filtering the precipitate separated out.

The GPC analysis of the reaction product P-3 was performed and found that the weight average molecular weight as converted into standard polystyrene was 10,700.

The reaction product P-3 contains a compound having a structural unit represented by the following formula (13)

[Chemical Formula 19]

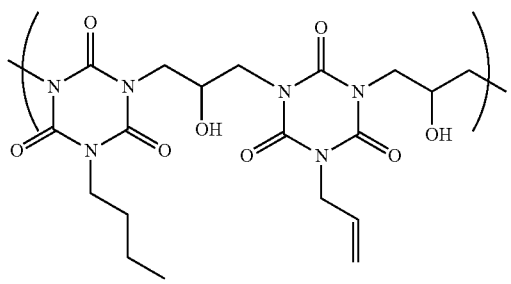

(13)

Comparative Synthesis Example 1

Synthesis of P-4

4.86 g of p-phenylene diamine and 1.74 g of 4-hexadecyloxy-1,3-diaminobenzene were dissolved in 122.5 g of NMP, and then 15.01 g of 3,4-dicarboxy-1,2,3,4-tetrahydro-1-naphthalene succinic acid dianhydride was added, followed by 10-hour stirring at room temperature to carried out a polymerization reaction. The produced polyamide acid solution was diluted with NMP to 8% by weight. To 50 g of this solution, 10.8 g of acetic anhydride and 5.0 g of pyridine were added as imidation catalysts, followed by reacting for 3 hours at 50° C. to produce a polyimide solution. This solution was charged into a large amount of methanol, and the resultant white precipitation was filtered and dried to produce white polyimide powder. It was found by 1H-NMR that 90% of this polyimide powder was imidated.

The number-average molecular weight (Mn) and the weight-average molecular weight (Mw) of the produced polyimide were Mn=18,000 and Mw=54,000, respectively.
(Preparing Gate Insulating Film Forming Agent for Thin-film Transistor)

Example 1

Preparing Insulating Film Forming Agent A

In the mixed solvent of 16.24 g of γ-butyrolactone and 3.43 g of dipropylene glycol monomethylether, 3.20 g of P-1 (white powder) produced in Synthesis Example 1 was dissolved to produce an insulating film forming agent A with a solid concentration of 14% by mass.

Example 2

Preparing Insulating Film Forming Agent B

In the mixed solvent of 3.9 g of propylene glycol monomethylether, 2.9 g of propylene glycol monomethylether acetate, and 2.9g of γ-butyrolactone, 2.0 g of P-2 (white powder) produced in Synthesis Example 2 was dissolved to produce an insulating film forming agent B with a solid concentration of 17% by mass.

Example 3

Preparing Insulating Film Forming Agent C

In the mixed solvent of 3.75 g of γ-butyrolactone and 3.33 g of dipropylene glycol monomethylether, 1.25 g of P-3 (white powder) produced in Synthesis Example 3 was dissolved to produce an insulating film forming agent C with a solid concentration of 15% by mass.

Comparative Example 1

Preparing Insulating Film Forming Agent D

In the mixed solvent of 52.67 g of γ-butyrolactone and 10 g of butyl cellosolve, 4 g of P-4 (white polyimide powder) produced in Comparative Synthesis Example 1 was dissolved to produce an insulating film forming agent D with a solid concentration of 6% by mass.
(Producing Gate Insulating Film and Evaluating Electric Properties of the Insulating Film in Nitrogen Atmosphere)

Example 4

Gate Insulating Film Using Insulating Film Forming Agent A

On a glass substrate (2.5 cm square, thickness of 0.7 mm) with ITO, the insulating film forming agent A prepared in Example 1 was dropped using a syringe equipped with a filter with a pore size of 0.2 μm and applied by spin coating. Subsequently, in the air, the coated substrate was subjected to a heat treatment (predrying) on a hot plate at 80° C. for 5 minutes to volatilize the organic solvent. Next, the resultant substrate was baked on a hot plate at 180° C. for 60 minutes to produce a gate insulating film with a film thickness of about 200 nm.

Next, a sample for evaluation of insulating properties of a gate insulating film, on which electrodes were placed on the top and bottom, was prepared by depositing gold electrodes with a diameter of 1.0 mm to 2.0 mm and a film thickness of 60 nm on the gate insulating film using a vacuum deposition equipment This vacuum deposition was conducted at room temperature under a degree of vacuum of $1 \times 10^{-3}$ Pa or less, and at the deposition rate of gold 0.1 nm/sec or less.

The sample was used for the measurement of the current-voltage properties in a nitrogen atmosphere. Positive voltage from 0 V to 60 V was applied on the gold electrode side with 10-second retention time at each increment of 2 V to determine the specific resistance from the current value at an electric field of 1 MV/cm. The results are shown in Table I.

Example 5

Gate Insulating Film Using Insulating Film Forming Agent B

Using the insulating film forming agent B prepared in Example 2, a gate insulating film was produced on a substrate in substantially the same procedure as in Example 4 except that the film thickness of the gate insulating film was 400 nm.

Subsequently, a sample for the evaluation of insulating properties was prepared in substantially the same procedure as in Example 4, and the current-voltage properties were measured to determine the specific resistance. The results are shown in Table 1.

Example 6

Gate Insulating Film Using Insulating Film Forming Agent C

Using the insulating film forming agent C prepared in Example 3, a gate insulating film was produced on a substrate in substantially the same procedure as in Example 4 except that the film thickness of the gate insulating film was 400 nm.

Subsequently, a sample for the evaluation of insulating properties was prepared in substantially the same procedure as in Example 4, and the current-voltage properties were measured to determine the specific resistance. The results are shown in Table 1.

Comparative Example 2

Gate Insulating Film Using Insulating Film Forming Agent D

Using the insulating film forming agent D prepared in Example 1, a gate insulating film was produced on a substrate in substantially the same procedure as in Example 4 except that the film thickness of the gate insulating film was 200 nm.

Subsequently, a sample for the evaluation of insulating properties was prepared in substantially the same procedure as in Example 4, and the current-voltage properties were measured to determine the specific resistance. The results are shown in Table 1.

TABLE 1

Electric Properties of Gate Insulating Film (in Nitrogen Atmosphere)

| | | Film thickness | Specific Resistance/Ωcm |
|---|---|---|---|
| Example 4 | Insulating Film Forming Agent A | 200 nm | $4.1 \times 10^{16}$ |
| Example 5 | Insulating Film Forming Agent B | 400 nm | $5.8 \times 10^{16}$ |
| Example 6 | Insulating Film Forming Agent C | 400 nm | $5.0 \times 10^{16}$ |
| Comparative Example 2 | Insulating Film Forming Agent D | 200 nm | $2.1 \times 10^{16}$ |

As shown in Table 1, the gate insulating films of Examples 4 to 6 showed the specific resistance values similar to or higher than that of the gate insulating film of Comparative Example 2 (soluble polyimide), indicating that the gate insulating films can be suitably used as gate insulating films for a thin-film transistor.

(Producing Gate Insulating Film and Evaluating Electric Properties of the Insulating Film in Air)

Example 7

Gate Insulating Film Using Insulating Film Forming Agent A

Using the insulating film forming agent A prepared in Example 1, a gate insulating film was prepared on a substrate in substantially the same procedure as in Example 4 except that the film thickness of the gate insulating film was 400 nm.

Subsequently, a sample for the evaluation of insulating properties was prepared in substantially the same procedure as in Example 4.

Next, after the exposure of the above sample to the air for 30 minutes, the current-voltage properties were measured in substantially the same procedure as in Example 4 except that the measurement was conducted in the air, to determine the specific resistance. The results are shown in Table 2.

Example 8

Gate Insulating Film Using Insulating Film Forming Agent B

A gate insulating film was produced on a substrate in substantially the same procedure as in Example 7 except that the insulating film forming agent B prepared in Example 2 was used.

Subsequently, a sample for the evaluation of insulating properties was prepared in substantially the same procedure as in Example 7, and the current-voltage properties were measured to determine the specific resistance. The results are shown in Table 2.

Example 9

Gate Insulating Film Using Insulating Film Forming Agent C

A gate insulating film was produced on a substrate in substantially the same procedure as in Example 7 except that the insulating film forming agent C prepared in Example 3 was used.

Subsequently, a sample for the evaluation of insulating properties was prepared in substantially the same procedure as in Example 7, and the current-voltage properties were measured to determine the specific resistance. The results are shown in Table 2.

Comparative Example 3

Gate Insulating Film Using Insulating Film Forming Agent D

A gate insulating film was produced on a substrate in substantially the same procedure as in Example 7 except that the insulating film forming agent D prepared in Comparative Example 1 was used.

Subsequently, a sample for the evaluation of insulating properties was prepared in substantially the same procedure as in Example 7, and the current-voltage properties were measured to determine the specific resistance. The results are shown in Table 2.

TABLE 2

Electric Properties of Gate Insulating Film (in Air)

|  |  | Film thickness | Specific Resistance/Ωcm |
|---|---|---|---|
| Example 7 | Insulating Film Forming Agent A | 400 nm | $9.7 \times 10^{15}$ |
| Example 8 | Insulating Film Forming Agent B | 400 nm | $2.1 \times 10^{16}$ |
| Example 9 | Insulating Film Forming Agent C | 400 nm | $7.5 \times 10^{15}$ |
| Comparative Example 3 | Insulating Film Forming Agent D | 400 nm | $8.0 \times 10^{15}$ |

As shown in Table 2, the gate insulating films of Examples 7 to 9 evaluated with being exposed to the air showed the specific resistance values similar to or higher than that of the gate insulating film of Comparative Example 3 (soluble polyimide) measured under substantially the same conditions, indicating that the gate insulating films can be suitably used as gate insulating films for a thin-film transistor.

(Producing Gate Insulating Film and Evaluating Electric Properties of the Insulating Film After Irradiation of Ultraviolet Rays)

Example 10

Gate Insulating Film Using Insulating Film Forming Agent A: Baking Temperature of 180° C.

Using the insulating film forming agent A prepared in Example 1, gate insulating films were prepared on two substrates, in substantially the same procedure as in Example 4 except that the film thickness of the gate insulating film was 400 nm.

Next, the gate insulating film on one of the substrates was exposed to ultraviolet rays at 20 J/cm² through a bandpass filter through which a light around a wave length of 254 nm passes with a high pressure mercury lamp used as a light source. The light exposure on the gate insulating film was calculated by multiplying the illuminance of ultraviolet rays which was measured by using an illuminometer (UV-MO2; manufactured by ORC MANUFACTURING CO., LTD.) (illuminance: 3.8 to 4.8 mW/cm²) by the exposure time.

Subsequently, samples for the evaluation of insulating properties were prepared from a substrate with a gate insulating film exposed to ultraviolet rays at 20 J/cm² (exposed) and another substrate with a gate insulating film which was not exposed to ultraviolet rays (non-exposed), in substantially the same procedure as in Example 4 except that the diameter of a deposited gold electrode was 1.5 mm, and the current-voltage properties were measured to determine the specific resistance. The results are shown in Table 3.

Example 11

Gate Insulating Film Using Insulating Film Forming Agent A: Baking Temperature of 200° C.

A gate insulating film was produced on a substrate in substantially the same procedure as in Example 10 except that the baking temperature of the gate insulating film was 200° C.

Subsequently, after the irradiation of ultraviolet rays in substantially the same procedure as in Example 10, samples for the evaluation of insulating properties were prepared, and the current-voltage properties were measured to determine the specific resistance. The results are shown in Table 3.

Example 12

Gate Insulating Film Using Insulating Film Forming Agent C: Baking Temperature of 230° C.

A gate insulating film was produced on a substrate in substantially the same procedure as in Example 10 except that the baking temperature of the gate insulating film was 230° C.

Subsequently, after the irradiation of ultraviolet rays in substantially the same procedure as in Example 10, samples for the evaluation of insulating properties were prepared, and the current-voltage properties were measured to determine the specific resistance. The results are shown in Table 3.

Comparative Example 4

Gate Insulating Film Using Insulating Film Forming Agent D

A gate insulating film was produced on a substrate in substantially the same procedure as in Example 10 except that the solution of the insulating film forming agent D prepared in Comparative Example 1 was used.

Subsequently, after the irradiation of ultraviolet rays in substantially the same procedure as in Example 10, samples for the evaluation of insulating properties were prepared, and the current-voltage properties were measured to determine the specific resistance. The results are shown in Table 3.

TABLE 3

Electric Properties of Gate Insulating Film: Change in Baking Temperature and Light Resistance

|  |  |  | Specific Resistance/Ωcm | |
|---|---|---|---|---|
|  |  | Baking Temperature | Non-exposed | Exposed |
| Example 10 | Insulating Film Forming Agent A | 180° C. | $3.6 \times 10^{16}$ | $4.2 \times 10^{16}$ |
| Example 11 | Insulating Film Forming Agent A | 200° C. | $4.3 \times 10^{16}$ | $4.2 \times 10^{16}$ |
| Example 12 | Insulating Film Forming Agent A | 230° C. | $4.2 \times 10^{16}$ | $3.9 \times 10^{16}$ |
| Comparative Example 4 | Insulating Film Forming Agent D | 180° C. | $2.7 \times 10^{16}$ | $5.4 \times 10^{15}$ |

As shown in Table 3, the specific resistances of the gate insulating films of Examples 10 to 12 showed almost no change after the irradiation of ultraviolet rays, while the specific resistance value of the gate insulating film of Comparative Example 4 (soluble polyimide) markedly decreased after the irradiation of ultraviolet rays.

Therefore, the results indicated that the gate insulating films of Examples 10 to 12 were far superior in light resistance to the gate insulating film of Comparative Example 4.

(Producing Organic Thin-Film Transistor and Evaluating Electric Properties of the Transistor)

Example 13

Organic Thin-Film Transistor Using Insulating Film Formed Using Insulating Film Forming Agent A Using the insulating film forming agent A prepared in Example 1, a gate insulating film was produced on a substrate in substantially the same procedure as in Example 4 except that the film thickness of the gate insulating film was 400 nm.

The electrostatic capacity C of this gate insulating film was calculated from the dielectric constant and the film thickness of the insulating film and found to be $6.47 \times 10^{-9}$ (F/cm$^2$).

Next, a semiconductor layer was formed on the above described gate insulating film.

First, poly(3-hexylthiophene-2,5-diyl) (available from Merck KGaA, hereinafter abbreviated to as P3HT) was dissolved in xylene in a concentration of 1% by mass to prepare a P3HT coating solution, and the coating solution was applied on the above mentioned gate insulating film by spin coating in a nitrogen atmosphere with an oxygen concentration of 0.5 ppm or less.

Subsequently, the resultant film was heated for 90 minutes at 100° C. under vacuum condition to completely volatilize the solvent, thereby forming a semiconductor layer.

Furthermore, a source-drain electrode with a channel length L of 90 μm and a channel width W of 2 mm was formed by depositing gold with a thickness of about 60 nm on the above described semiconductor layer using vacuum deposition equipment to complete an organic thin-film transistor. The organic thin-film transistor the cross sectional view of which is shown in FIG. 2 corresponds to the organic thin-film transistor of Example 13.

This vacuum deposition was conducted at room temperature under a degree of vacuum of $1 \times 10^{-3}$ Pa or less, and at a deposition rate of gold of 0.1 nm/sec or less.

The electric properties of the thus produced organic thin-film transistor were evaluated by measuring the modulation of drain current with respect to the gate voltage.

In detail, at source-drain voltage (V$_D$) of −40 V, gate voltage (V$_G$) was reduced from +40 V to −40V by 2 V, while the current value produced after retaining each voltage for 3 seconds until the current stabilized was recorded as a measurement value of the drain current. The measurement was conducted by using a semiconductor parameter analyzer HP4156C (manufactured by Agilent Technologies, Inc.).

FIG. 5 shows the thus measured properties of drain current gate voltage (V$_G$–I$_D$ properties). After gate voltage was negatively applied, the drain current markedly increased, indicating that P3HT acted as a p-type semiconductor.

Generally, drain current I$_D$ under saturated conditions can be represented by the following formula. Therefore, mobility μ of the organic semiconductor can be determined based on the gradient of a graph produced by plotting the square root of an absolute value of drain current I$_D$ on the vertical axis and gate voltage V$_G$ on the horizontal axis.

$$I_D = WC\mu(V_G - V_T)2/2L$$

where W is the channel width of a transistor, L is the channel length of the transistor, C is the electrostatic capacity of a gate insulating film, V$_T$ is the threshold voltage of the transistor, and μ is mobility. The mobility μ of P3HT was calculated by using this formula, and found to be $2.3 \times 10^{-3}$ cm$^2$/Vs. The threshold voltage was 5 V, and the ratio of an on state to an off state (on/off ratio) was in the order of 10$^3$ (Table 3).

The electric properties of the organic thin-film transistor was measured with keeping a degree of vacuum of $5 \times 10^{-2}$ Pa or less after an element was completed, and then was moved immediately under vacuum (a degree of vacuum of $5 \times 10^{-2}$ Pa or less) to exclude the influence of ambient humidity and active substances and left as it is for about 30 minutes.

Comparative Example 5

Organic Thin-film Transistor Using Gate Insulating Film Formed Using Insulating Film Forming Agent D A gate insulating film was produced in substantially the same procedure as in Example 13 except that the solution of the insulating film forming agent D synthesized in Comparative Example 1 was used. The electrostatic capacity C of the gate insulating film was calculated from the dielectric constant and the film thickness of polyimide, and found to be $6.87 \times 10^{-9}$ (F/cm$^2$).

Furthermore, an organic thin-film transistor was prepared in substantially the same procedure as in Example 13 to measure the electric properties. The results are shown in FIG. 5 and Table 4. The mobility of P3HT was $1.1 \times 10^{-3}$ cm$^2$/Vs; the threshold voltage was 5 V; and the on/off ratio was in the order of 10$^3$.

TABLE 4

| Properties of Organic Thin-film Transistor | | Mobility (cm$^2$/Vs) | Threshold voltage (V) | On/off ratio |
| --- | --- | --- | --- | --- |
| Example 13 | Insulating Film Forming Agent A | $2 \times 10^{-3}$ | 5 | 10$^3$ |
| Comparative Example 5 | Insulating Film Forming Agent D | $1 \times 10^{-3}$ | 5 | 10$^3$ |

As shown in Table 4, the organic thin-film transistor of Example 13, in which the insulating film forming agent A was baked at 180° C. to be used for the gate insulating film, showed the electric properties similar to or higher than those of the organic thin-film transistor of Comparative Example 5 in which a soluble polyimide was used for a gate insulating film.

Example 14

On two glass substrates (2.5 cm square, thickness of 0.7 mm) with ITO, the insulating film forming agent A prepared in Example 1 was dropped using a syringe equipped with a filter with a pore size of 0.2 μm and applied by spin coating. Subsequently, in the air, the coated substrates were subjected to a heat treatment (predrying) on a hot plate at 80° C. for 5 minutes to volatilize the organic solvent. Next, the resultant substrates were baked on a hot plate at 160° C. for 30 minutes to produce gate insulating films with a film thickness of 400 nm.

Next, the gate insulating film on one of the substrates was exposed to ultraviolet rays at 20 J/cm$^2$ through a bandpass filter through which a light around a wave length of 254 nm passes with a high pressure mercury lamp used as a light source. The light exposure on the gate insulating film was calculated by multiplying the illuminance of ultraviolet rays which was measured by using an illuminometer (MODEL 306 manufactured by OAI) (illuminance: 45 mW/cm$^2$) by the exposure time.

Subsequently, aluminum electrodes with a diameter of 1.5 mm and a film thickness of 100 nm were deposited on the gate insulating films of a substrate with a gate insulating film exposed to ultraviolet rays at 20 J/cm$^2$ (exposed) and of another substrate with a gate insulating film which was not exposed to ultraviolet rays (non-exposed), by using a vacuum deposition equipment. Thus, samples for the evaluation of insulating properties of the gate insulating films on which electrodes were placed on the top and bottom were prepared. This vacuum deposition was conducted at room temperature under a degree of vacuum of $1 \times 10^{-3}$ Pa or less, and at a deposition rate of aluminum of 0.1 nm/sec or less.

The samples were used for the measurement of the current-voltage properties in a nitrogen atmosphere. Positive voltage from 0 V to 50 V was applied on the aluminum electrode side with 3-second retention time at each increment of 2 V, to determine the specific resistance from the current value at an electric field of 1 MV/cm. The results are shown in Table 5.

Example 15

A gate insulating film was produced on a substrate in substantially the same procedure as in Example 14 except that the insulating film forming agent B prepared in Example 2 was used.

Subsequently, after the irradiation of ultraviolet rays in substantially the same procedure as in Example 14, samples for the evaluation of insulating properties were prepared, and the current-voltage properties were measured to determine the specific resistance. The results are shown in Table 5.

Example 16

A gate insulating film was produced on a substrate in substantially the same procedure as in Example 14 except that the insulating film forming agent C prepared in Example 3 was used.

Subsequently, after the irradiation of ultraviolet rays in substantially the same procedure as in Example 14, samples for the evaluation of insulating properties were prepared, and the current-voltage properties were measured to determine the specific resistance. The results are shown in Table 5.

TABLE 5

Electric Properties of Gate Insulating Film: Change and Light Resistance of Insulating Film Forming Agent

| | | Specific Resistance/Ωcm | |
|---|---|---|---|
| | Baking temperature | Non-exposed | Exposed |
| Example 14 | Insulating Film Forming Agent A | 160° C. | $1.9 \times 10^{16}$ | $2.0 \times 10^{16}$ |
| Example 15 | Insulating Film Forming Agent B | 160° C. | $3.7 \times 10^{16}$ | $2.3 \times 10^{16}$ |
| Example 16 | Insulating Film Forming Agent C | 160° C. | $2.9 \times 10^{16}$ | $2.2 \times 10^{16}$ |

As shown in Table 5, the gate insulating films of Example 14 to Example 16 had the specific resistance of $10^{16}$ Ωcm or more even after the irradiation of ultraviolet rays.

Thus, the results showed that the gate insulating films of Example 14 to Example 16 prepared by using the insulating film forming agent A to the insulating film forming agent C had high insulation properties as well as markedly excellent light resistance.

DESCRIPTION OF THE REFERENCE NUMERALS

Figure 1:
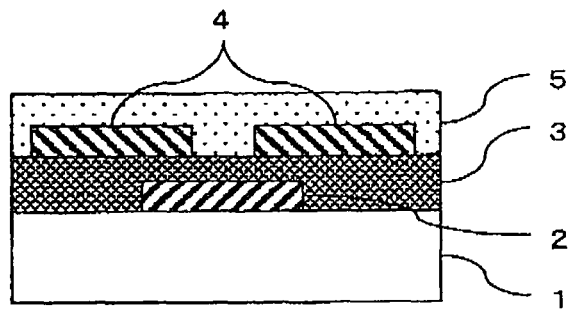
FIG. 1 is a schematic cross-sectional view showing the structure of the thin-film transistor of a first example with a gate insulating film of the present invention.
Figure 2:
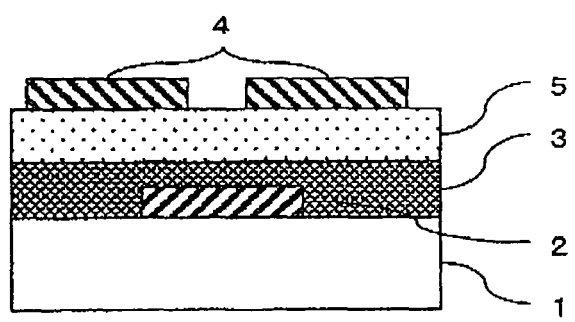
FIG. 2 is a schematic cross-sectional view showing the structure of the thin-film transistor of a second example with the gate insulating film of the present invention.
Figure 3:
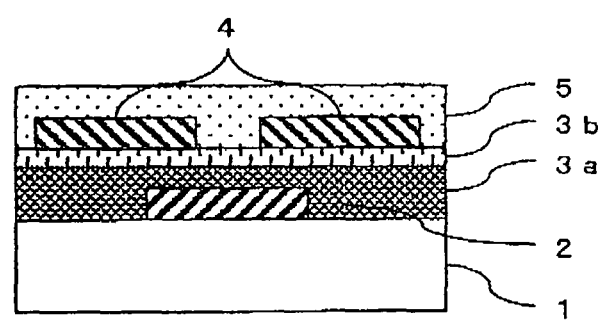
FIG. 3 is a schematic cross-sectional view showing the structure of the thin-film transistor of a third example with the gate insulating film of the present invention.
Figure 4:
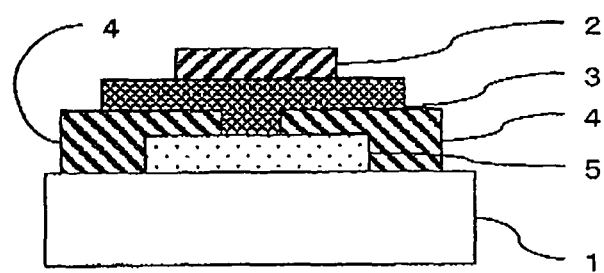
FIG. 4 is a schematic cross-sectional view showing the structure of the thin-film transistor of a fourth example with the gate insulating film of the present invention.
Figure 5:
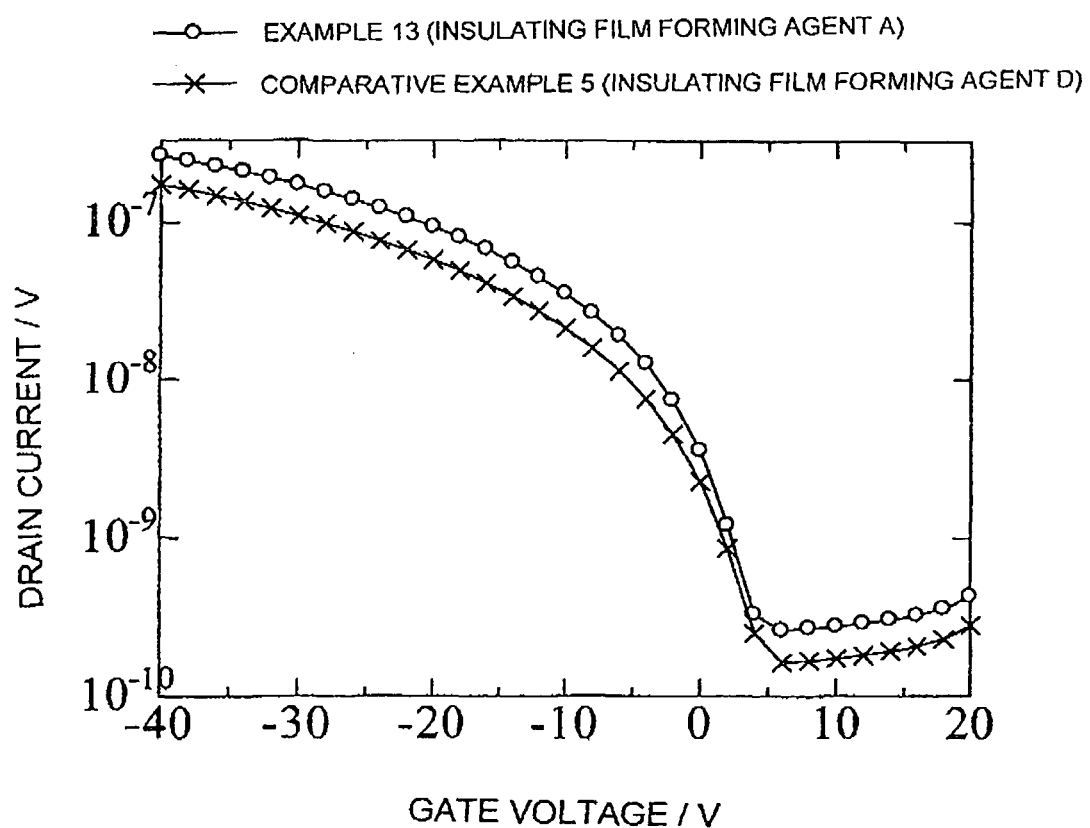
FIG. 5 is a graph indicating the relationship between the drain current and the gate voltage of an organic thin-film transistor including a gate insulating film produced from an insulating film forming agent A and an insulating film forming agent D in Example 10 and Comparative Example 4.

1 Substrate
2 Gate electrode
3 (3*a*, 3*b*) Gate insulating film
4 Source electrode, drain electrode
5 Semiconductor layer

The invention claimed is:
1. A thin-film transistor comprising:
   a substrate;
   a gate electrode;
   a gate insulating film comprising an oligomer compound or a polymer compound with a repeating unit represented by the following formula (1):

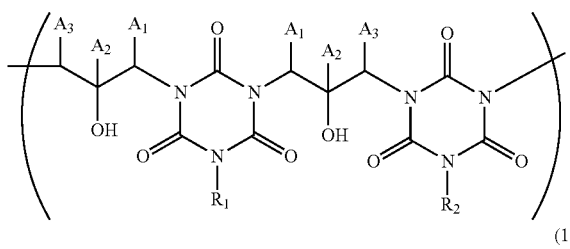

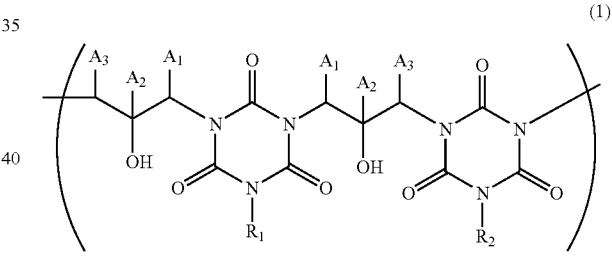

where $R_1$ and $R_2$ independently represent an alkyl group with 1 to 6 carbon atoms, an alkenyl group with 3 to 6 carbon atoms, a trifluoromethyl group, or a pentafluoroethyl group, and $A_1$, $A_2$, and $A_3$ independently represent a hydrogen atom, a methyl group, or an ethyl group;
   source and drain electrodes; and
   a semiconductor layer.
2. The thin-film transistor according to claim 1, wherein the oligomer compound or the polymer compound is a reaction product between compounds represented by the following formula (2) and formula (3):

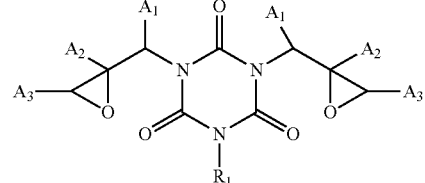

-continued (3)

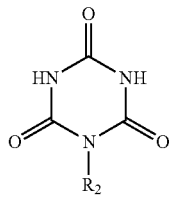

where $R_1$, $R_2$, $A_1$, $A_2$, and $A_3$ are the same as defined in the formula (1).

3. The thin-film transistor according to claim 1, wherein the oligomer compound or the polymer compound with the repeating unit represented by the formula (1) is blocked at the end with a group represented by the following formula (4) or formula (5):

(4)

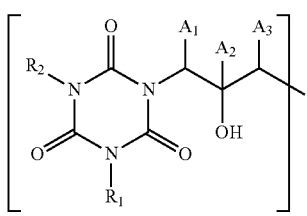

(5)

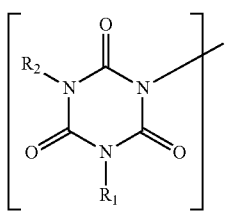

where $R_1$, $R_2$, $A_1$, $A_2$, and $A_3$ are the same as defined in the formula (1).

4. The thin-film transistor according to claim 2, wherein the oligomer compound or the polymer compound with the repeating unit represented by the formula (1) is blocked at the end with the group represented by the following formula (4) or formula (5):

(4)

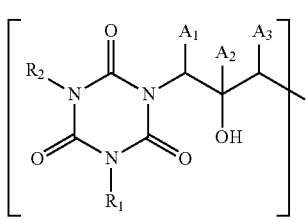

(5)

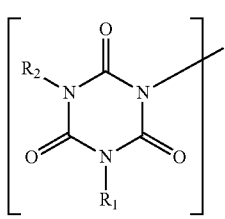

by reacting a compound represented by the following formula (6) or formula (7) as a terminal blocking agent with the reaction product between the compounds represented by the formula (2) and formula (3):

(6)

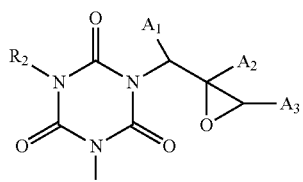

(7)

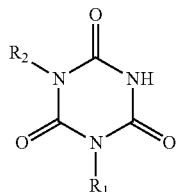

(7)

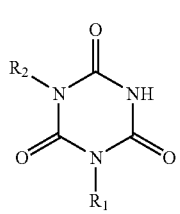

where $R_1$, $R_2$, $A_1$, $A_2$, and $A_3$ are the same as defined in the formula (1).

5. A method for producing a thin film transistor, the method comprising:

providing a substrate;

providing a gate electrode;

providing source and drain electrodes;

providing a semiconductor layer; and applying a gate insulating film forming agent comprising an oligomer compound or a polymer compound on the substrate, and then baking at a temperature of 180° C. or lower; wherein the oligomer compound or the polymer compound comprises a repeating unit represented by the following formula (1):

(1)

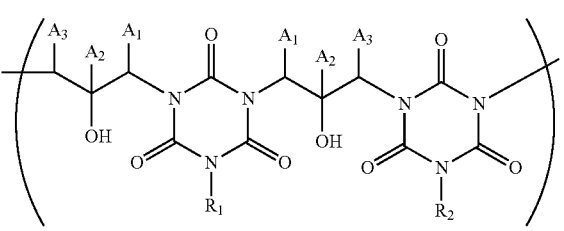

-continued

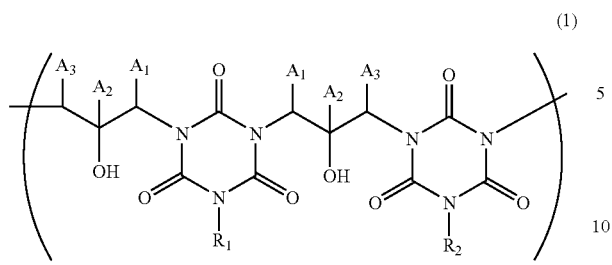

(1)

where $R_1$ and $R_2$ independently represent an alkyl group with 1 to 6 carbon atoms, an alkenyl group with 3 to 6 carbon atoms, a trifluoromethyl group, or a pentafluoroethyl group, and $A_1$, $A_2$, and $A_3$ independently represent a hydrogen atom, a methyl group, or an ethyl group.

6. The method for producing a thin-film transistor according to claim 5, the method further comprising:

forming the semiconductor layer of the thin-film transistor by applying an organic semiconductor.

7. The method for producing a thin-film transistor according to claim 5, wherein the oligomer compound or the polymer compound is a reaction product between compounds represented by the following formula (2) and formula (3):

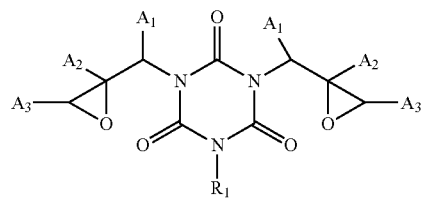

(2)

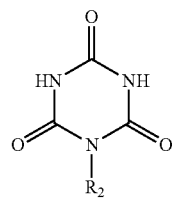

(3)

where $R_1$, $R_2$, $A_1$, $A_2$, and $A_3$ are the same as defined in the formula (1).

8. The method for producing a thin-film transistor according to claim 5, wherein the oligomer compound or the polymer compound with the repeating unit represented by the formula (1) is blocked at the end with a group represented by the following formula (4) or formula (5):

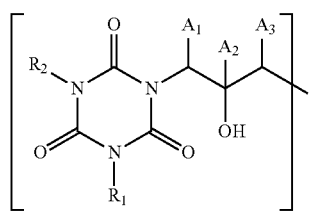

(4)

-continued

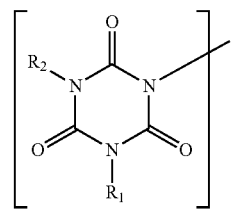

(5)

where $R_1$, $R_2$, $A_1$, $A_2$, and $A_3$ are the same as defined in the formula (1).

9. The method for producing a thin-film transistor according to claim 7, wherein the oligomer compound or the polymer compound with the repeating unit represented by the formula (1) is blocked at the end with the group represented by the following formula (4) or formula (5):

(4)

(5)

by reacting a compound represented by the following formula (6) or formula (7) as a terminal blocking agent with the reaction product between the compounds represented by the formula (2) and formula (3):

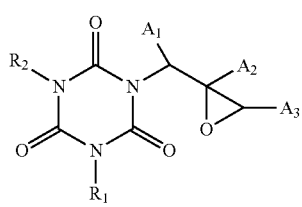

(6)

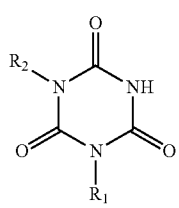

(7)

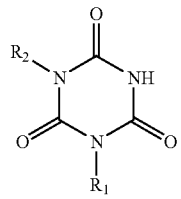
(7)
where $R_1$, $R_2$, $A_1$, $A_2$, and $A_3$ are the same as defined in the formula (1).
* * * * *